(12) United States Patent
Kang et al.

(10) Patent No.: US 7,326,966 B2
(45) Date of Patent: Feb. 5, 2008

(54) ELECTROLUMINESCENCE DISPLAY DEVICE AND METHOD OF MANUFACTURING THE SAME

(75) Inventors: Tae-Wook Kang, Suwon-si (KR); Chang-Soo Kim, Suwon-si (KR); Chang-Yong Jeong, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 282 days.

(21) Appl. No.: 11/145,955

(22) Filed: Jun. 7, 2005

(65) Prior Publication Data

US 2005/0285114 A1 Dec. 29, 2005

(30) Foreign Application Priority Data

Jun. 26, 2004 (KR) ............. 10-2004-0048647

(51) Int. Cl.
*H01L 33/00* (2006.01)
*H01L 29/04* (2006.01)
*H01L 31/036* (2006.01)

(52) U.S. Cl. .................. 257/98; 257/72; 257/99
(58) Field of Classification Search .......... 257/98–99, 257/40, 81, 59, 72
See application file for complete search history.

(56) References Cited

U.S. PATENT DOCUMENTS

| | | | |
|---|---|---|---|
| 6,689,492 B1 * | 2/2004 | Yamazaki et al. | 428/690 |
| 7,259,813 B2 * | 8/2007 | Oda et al. | 349/113 |
| 2003/0201448 A1 * | 10/2003 | Yamazaki et al. | 257/79 |
| 2005/0067945 A1 * | 3/2005 | Nishikawa et al. | 313/501 |
| 2006/0097256 A1 * | 5/2006 | Yamazaki et al. | 257/59 |
| 2006/0262254 A1 * | 11/2006 | Inoue et al. | 349/113 |

* cited by examiner

*Primary Examiner*—Shouxiang Hu
(74) *Attorney, Agent, or Firm*—H.C. Park & Associates, PLC

(57) ABSTRACT

An electroluminescence display device including a thin film transistor layer formed on a substrate, at least one insulating layer, and a pixel layer that includes a first electrode layer, a second electrode layer, and an intermediate layer interposed between the first electrode layer and the second electrode layer and having at least an emitting layer. The pixel layer further includes a reflection layer that is disposed under the first electrode layer and that extends to a via hole formed in the insulating layer, and an auxiliary conductive layer is disposed under the reflection layer. The auxiliary conductive layer extends to the via hole, and the first electrode layer contacts at least a portion of the auxiliary conductive layer.

8 Claims, 9 Drawing Sheets

ELECTROLUMINESCENCE DISPLAY DEVICE AND METHOD OF MANUFACTURING THE SAME

CROSS REFERENCE TO RELATED APPLICATION

This application claims priority to and the benefit of Korean Patent Application No. 10-2004-0048647, filed on Jun. 26, 2004, which is hereby incorporated by reference for all purposes as if fully set forth herein.

BACKGROUND OF THE INVENTION

1. Field of the Invention

The present invention relates to an electroluminescence display device, and more particularly, to an electroluminescence display device that may prevent brightness non-uniformity due to a voltage drop in a display region.

2. Discussion of the Background

A variety of flat panel display devices have been recently developed to replace the conventional cathode ray tube (CRT). Generally, flat panel display devices are either emissive or non-emissive types. The emissive display devices, which do not require a separate light source, include flat CRTs, plasma display panel devices, vacuum fluorescent display devices, field emission display devices, and inorganic/organic electroluminescent display devices. The non-emissive display device includes liquid crystal display devices. The organic electroluminescent display device has drawn much attention because it is emissive, it does not consume a lot of power, and it is highly efficient. Further, it may be thin and lightweight, and it may have a wide viewing angle and quick response time.

The organic electroluminescent display device emits light having a specific wavelength by energy generated from exitons, which are formed when electrons and holes, injected through an anode and a cathode, recombine in an organic thin film.

A stacked organic electroluminescent unit of the organic electro-luminescent display device includes a first electrode (an anode), an intermediate layer including at least an emitting layer (EML), and a second electrode (a cathode). To increase the device's light emission efficiency, electrons and holes may be transferred to the organic EML. Accordingly, an electron transport layer (ETL) can be disposed between the cathode and the organic EML, and a hole transport layer (HTL) can be disposed between the anode and the organic EML. Also, a hole injection layer (HIL) can be disposed between the anode and the HTL, and an electron injection layer (EIL) can be disposed between the cathode and the ETL.

The organic electroluminescent display device may be a passive matrix (PM) or active matrix (AM) type depending upon its driving method. In a PM device, anodes and cathodes are simply arranged in columns and rows, respectively, and a row driving circuit sequentially supplies scanning signals to one cathode (i.e. row) at a time. Also, a column driving circuit supplies data signals to each pixel. On the other hand, the AM device controls signals inputted to each pixel using a thin film transistor (TFT). Hence, an AM device is typically used to display moving images since it can process a large number of signals.

FIG. 1A is a plan view of a conventional organic electroluminescent display device, and FIG. 1B is a cross-sectional view taken along line I-I of FIG. 1A.

The AM organic electroluminescent display device of FIG. 1A has a display region 20 that includes an organic light emitting diode (OLED) on a transparent substrate 11, and the display region 20 is sealed by a sealing member (not shown), such as a metal cap, and a sealing unit 80. The display region 20 comprises a plurality of pixels, and each pixel may include a TFT. A plurality of driving lines VDD 31 is disposed in the display region 20. The driving lines 31 supply power to the display region 20, and they are coupled to a terminal region 70 through a driving power supply line 32 disposed outside the display region 20.

As FIG. 1B shows, a TFT layer 10a for applying electrical signals to an electroluminescent unit in the display region 20 is formed on a surface of a substrate 11, and a pixel layer 10c that includes an electroluminescent unit is formed on the TFT layer 10a. An insulating layer 10b is interposed between the TFT layer 10a and the pixel layer 10c.

A via hole formed in the insulating layer 10b couples the TFT layer 10a with the pixel layer 10c. FIG. 1C is a magnified cross-sectional view showing portion "A" of FIG. 1B. Referring to FIG. 1C, a first insulating layer 18a may be formed on the drain electrode 17b, a second insulating layer 18b may be formed on the first insulating layer 18a, and via holes 18'a and 18'b may be formed in the insulating layers 18a and 18b.

With a front emission type electroluminescence display device, a reflection layer 19b may be formed below a first electrode layer 19a. The first electrode layer 19a supplies electrical signals to an intermediate layer 19c and is coupled to the drain electrode 17b of the TFT layer 10a through the via holes 18'a and 18'b.

Further, if the first electrode layer 19a is an anode, conventionally, the first electrode layer 19a may be formed of a transparent conductive oxide, such as, for example, indium tin oxide (ITO) having a large work function, and the reflection layer 19b may be formed of Al or Al/Nd. However, the transmittance of electrical signals from the drain electrode 17b to the electroluminescent unit disposed in an opened region defined by a pixel defining layer 19d may be adversely affected due to reduced conductivity resulting from an interface oxide layer formed between an ITO first electrode layer 19a and an Al/Nd metal reflection layer 19b. This can reduce brightness or cause brightness non-uniformity in the display region, thereby reducing image quality.

SUMMARY OF THE INVENTION

The present invention provides an electroluminescence display device having a structure that may prevent reduced brightness or brightness non-uniformity due to a voltage drop in a display region.

Additional features of the invention will be set forth in the description which follows, and in part will be apparent from the description, or may be learned by practice of the invention.

The present invention discloses an electroluminescence display device including a TFT layer formed on a substrate, an insulating layer, and a pixel layer that includes a first electrode layer, a second electrode layer, and an intermediate layer interposed between the first electrode layer and the second electrode layer and having at least an emitting layer. The pixel layer further includes a reflection layer that is disposed under the first electrode layer and that extends to a via hole formed in the insulating layer, and an auxiliary conductive layer is disposed under the reflection layer. The auxiliary conductive layer extends to the via hole and the first electrode layer contacts at least a portion of the auxiliary conductive layer.

The present invention also discloses a method of manufacturing an electroluminescence display device including forming a TFT layer on a substrate, forming an insulating layer on the TFT layer, forming a via hole in the insulating later, and forming a pixel layer that includes a first electrode layer, a second electrode layer, and an intermediate layer interposed between the first electrode layer and the second electrode layer, the intermediate layer having at least an emitting layer. Forming the pixel layer includes forming an auxiliary conductive layer that is coupled to the TFT through the via hole, forming a reflection layer on the auxiliary conductive layer so as to expose at least a portion of the auxiliary conductive layer, and forming the first electrode layer on the reflection layer and contacting the exposed portion of the auxiliary conductive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1A:
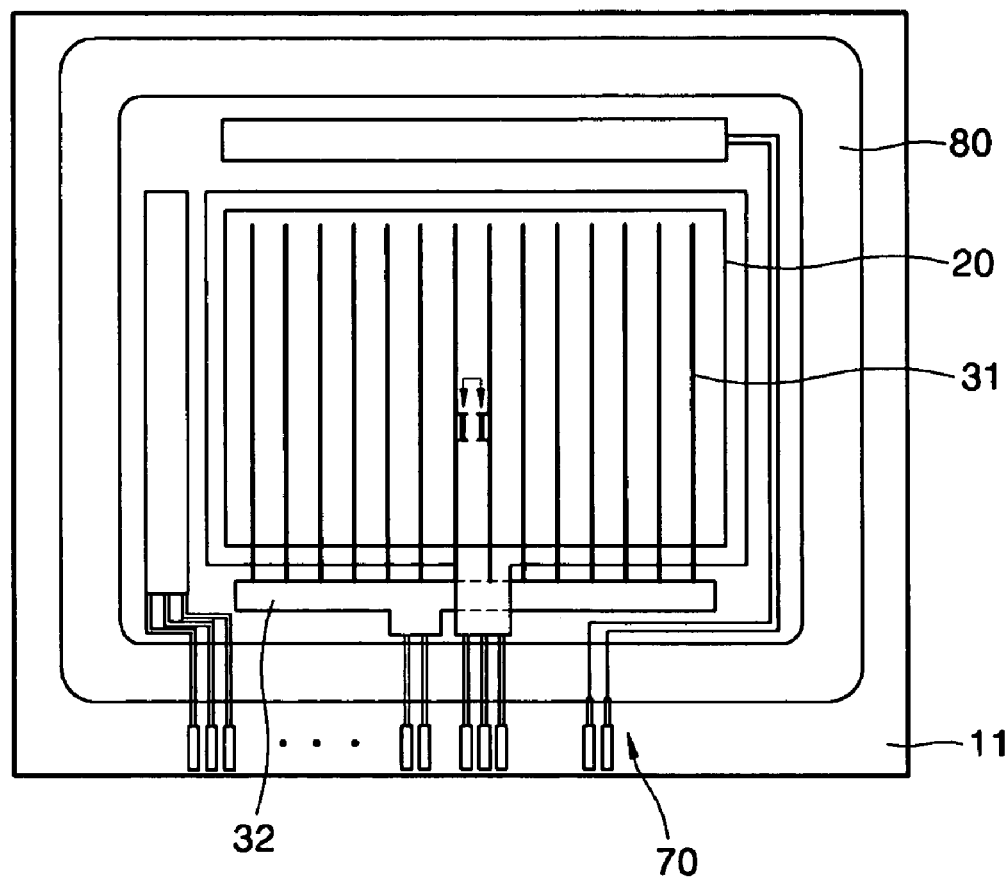
FIG. 1A is a plan view showing a conventional organic electroluminescence display device.
Figure 1B:
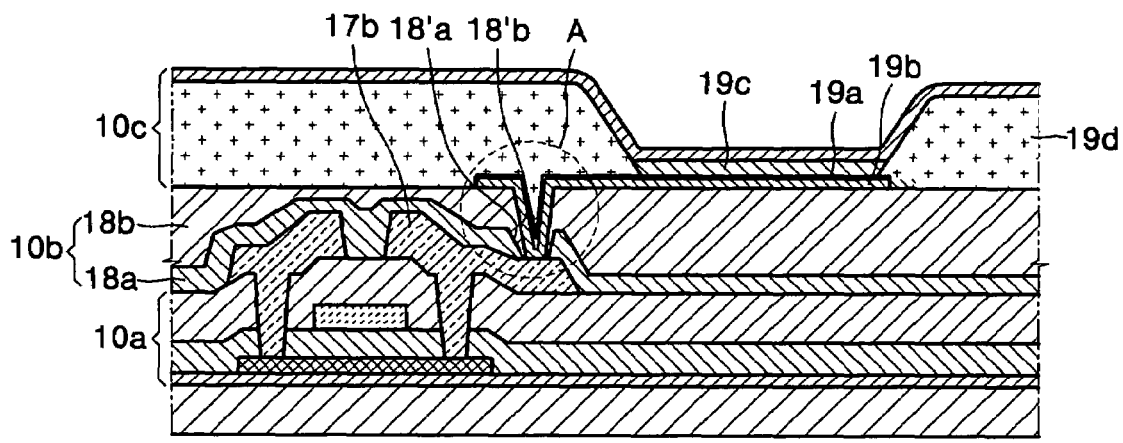
FIG. 1B is a cross-sectional view taken along line I-I of FIG. 1A.
Figure 1C:
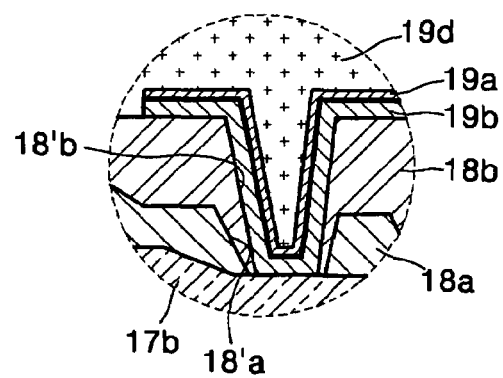
FIG. 1C is a magnified cross-sectional view of portion "A" of FIG. 1B.

The following describes embodiments of the present invention with reference to the drawings. Like numerals refer to like elements in the drawings.

Figure 2A:
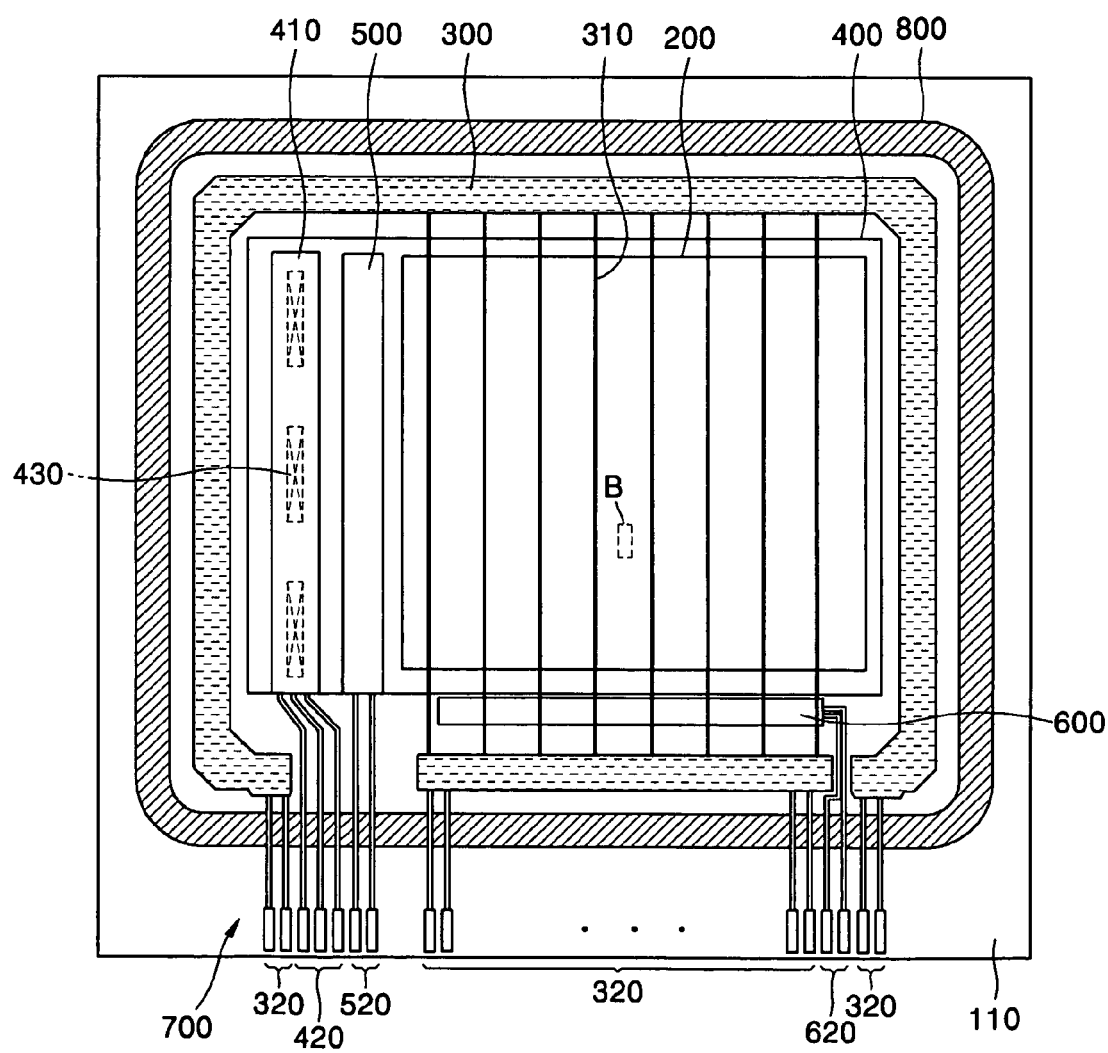
FIG. 2A is a plan view showing an organic electroluminescence display device according to an exemplary embodiment of the present invention.

FIG. 2A is a plan view showing an organic electroluminescent display device according to an exemplary embodiment of the present invention.

Referring to FIG. 2A, the organic electroluminescent display device may include a display region 200 on a surface of the substrate 110, a sealing unit 800 that seals the display region 200 with a sealing substrate (not shown) and a sealing member coated along an outer line of the display region 200, and a terminal region 700 on which various terminals are disposed. The sealing member may alternatively comprise more than one sealing layer formed of an organic or inorganic materials and/or a metal layer.

A driving power supply line 300 supplies power to the display region 200 and may be disposed in various areas, including between the display region 200 and the sealing unit 800. The driving power supply line 300 may surround the display region 200 to improve the display region's brightness uniformity by supplying uniform driving power to the display region 200.

The driving power supply line 300 may be coupled to a driving power line 310. The driving power line 310 may be disposed across the display region 200 and coupled to a drain electrode 170b, which is disposed under a protection layer 180 (refer to FIG. 2C).

Also, vertical/horizontal driving circuit units 500 and 600 are disposed outside the display region 200. The vertical circuit unit 500 can be a scan driver that applies scan signals to the display region 200, and the horizontal driving circuit unit 600 can be a data driver that applies data signals to the display region 200. The vertical/horizontal driving circuit units 500 and 600 may be an external integrated circuit (IC) or chip on glass (COG) unit.

An electrode power supply line 410, which supplies electrode power to the display region 200, is disposed outside the display region 200, and it may be coupled to a second electrode layer 400 through via holes 430 in insulating layers formed between the electrode power supply line 410 and the second electrode layer 400. The second electrode layer 400 may be formed on the entire upper part of the display region 200.

The driving power supply line 300, the electrode power supply line 410, and the vertical/horizontal driving circuit units 500 and 600 include terminals 320, 420, 520, and 620, respectively, and they are coupled with a terminal region 700 disposed outside the sealing region through wires.

Figure 2B:
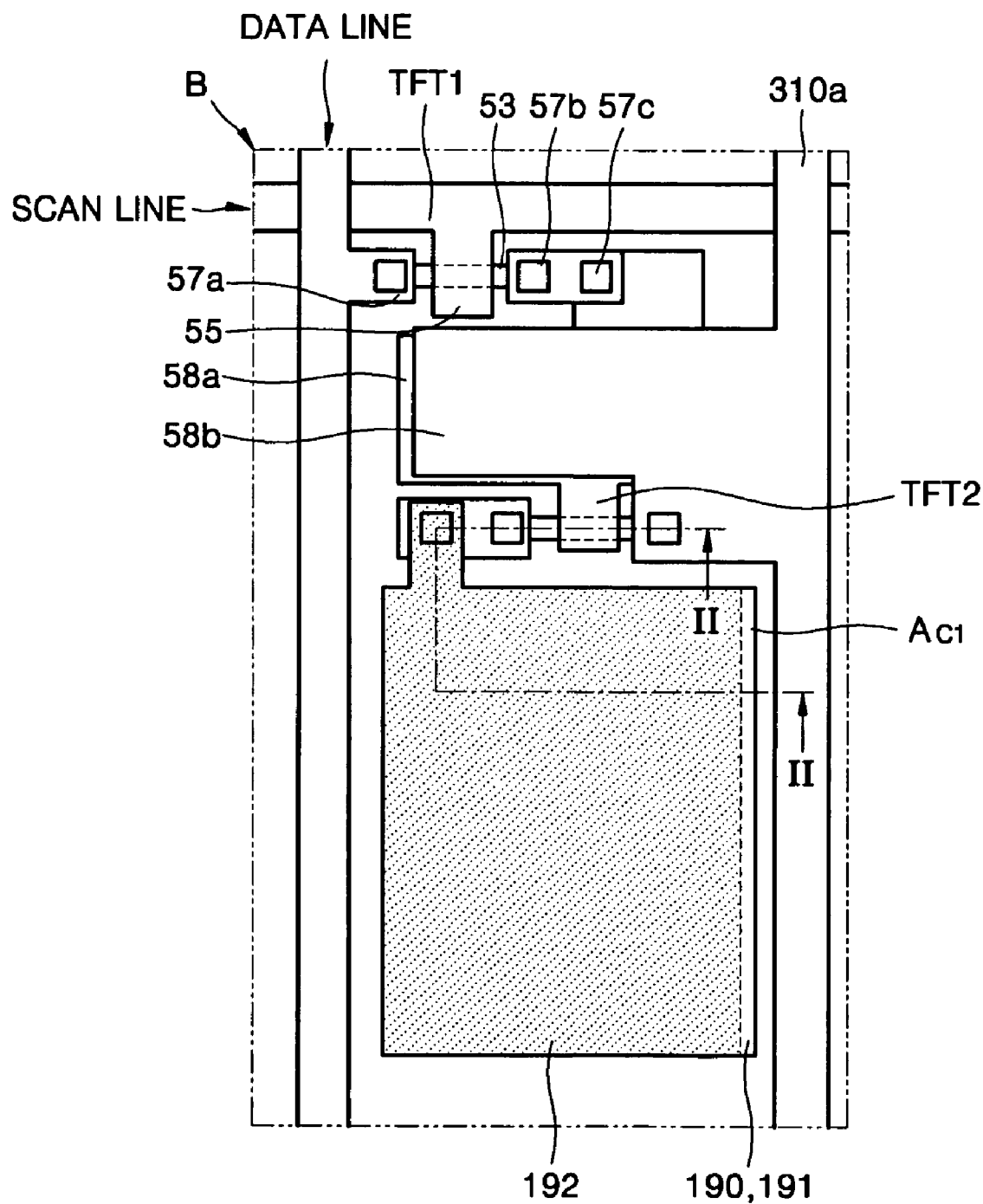
FIG. 2B is a magnified plan view of portion "B" of FIG. 2A.

The display region 200 will now be described with reference to FIG. 2B and FIG. 2C, which omit the sealing substrate and a sealing thin film layer for convenience of explanation. FIG. 2B shows a pixel of the display region indicated as "B" in FIG. 2A. The pixel includes two top gate type TFTs and one capacitor, but the present invention is not limited thereto.

A gate electrode 55 of a first thin film transistor TFT1 extends from a scan line that applies a scan signal. When applying an electrical signal, such as a scan signal, to the scan line, a data signal from a data line transmits from a source electrode 57a through a semiconductor active layer 53 to a drain electrode 57b of the first thin film transistor TFT1.

An extension unit 57c of the drain electrode 57b of the first thin film transistor TFT1 may be coupled to an end of a first electrode 58a of a capacitor, and the other end of the first electrode 58a of the capacitor may form a gate electrode 150 of a second thin film transistor TFT2, which is a driving TFT. A second electrode 58b of the capacitor may be coupled to a driving power line 310 (in FIG. 2A).

Figure 2C:
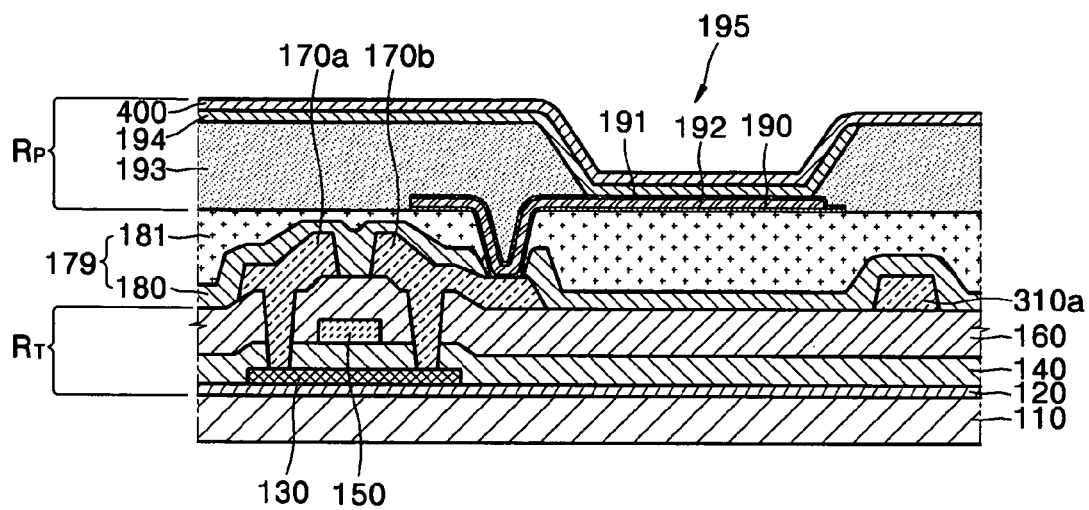
FIG. 2C is a cross-sectional view taken along line II-II of FIG. 2B.

FIG. 2C is a partial cross-sectional view taken along line II-II of FIG. 2B. Referring to FIG. 2C, a TFT layer $R_T$, an insulating layer 179 for protecting or planarizing the TFT layer $R_T$, and a pixel layer $R_p$ are included on a surface of the substrate 110. The pixel layer $R_p$ includes the first electrode layer 191, the second electrode layer 400 and an intermediate layer 194 having at least an emitting layer interposed between the first electrode layer 191 and the second electrode layer 400.

A more detailed description of this structure will now be described with reference to FIG. 3A, FIG. 3B, FIG. 3C and FIG. 3D, which show a method of manufacturing an organic electroluminescence display device according to an exemplary embodiment of the present invention.

Figure 3A:
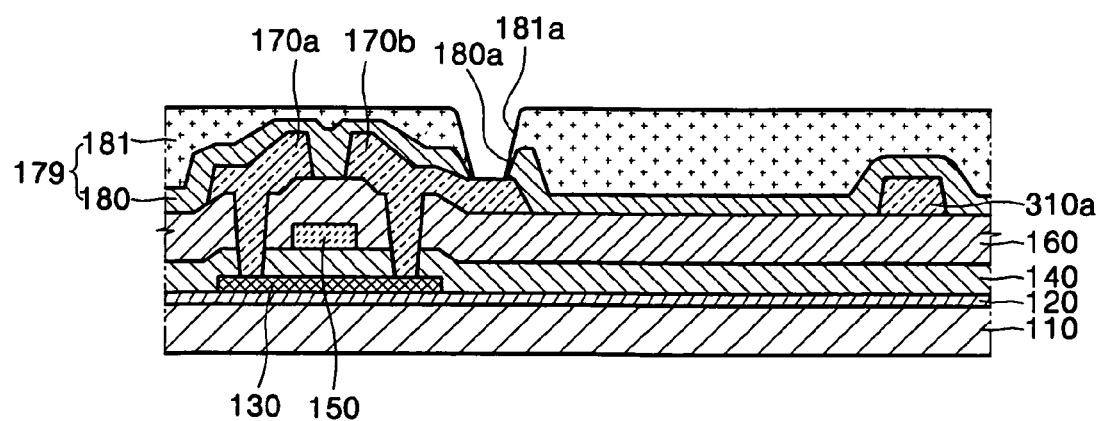
FIG. 3A, FIG. 3B, FIG. 3C, and FIG. 3D are cross-sectional views illustrating a method of manufacturing an organic electroluminescence display device according to an exemplary embodiment of the present invention.

First, as shown in FIG. 2C and FIG. 3A, a TFT layer $R_T$, as a second thin film transistor TFT2 for applying electrical signals to a pixel layer, and an insulating layer 179, formed of at least one layer on a surface of the TFT layer $R_T$, are provided on the substrate 110.

A semiconductor active layer 130 of the second thin film transistor TFT2 may be formed on a buffer layer 120, which may be formed on the substrate 110. The semiconductor active layer 130 can be an amorphous silicon layer or a poly silicon layer. Though not shown in detail, the semiconductor active layer 130 comprises source and drain regions doped with an N-type dopant or a P-type dopant and a channel region. The semiconductor active layer 130 can be formed of a variety of materials such as, for example, an organic semiconductor.

A gate electrode 150 of the second thin film transistor TFT2 may be disposed on a gate insulating layer 140, which may be formed on the semiconductor active layer 130 and the buffer layer 120. The gate electrode 150 may be formed of a material, such as MoW and Al/Cu, considering adherence to an adjacent layer, flatness of stacked layers, and process ability, but is not limited thereto.

An interlayer 160, which is a single or multiple layer insulating layer, may be formed on the gate electrode 150 and the gate insulating layer 140. Source/drain electrodes 170a and 170b of the second thin film transistor TFT2 may be formed on the interlayer 160. The source/drain electrodes 170a and 170b can be formed of MoW or Al, or they can be formed of a multiple layer of Mo/Al. The source/drain electrodes 170a and 170b may be subsequently heat treated for a smooth ohmic contact with the semiconductor active layer 130.

At least one insulating layer 179 may be formed on the source/drain electrodes 170a and 170b. The insulating layer 179 may comprise a passivation layer 180, which protects the TFT layer $R_T$ and/or a planarizing layer 181, for planarizing the TFT layer $R_T$, but the configuration is not limited thereto. The passivation layer 180 can be formed of an inorganic material, such as, for example, SiNx and SiO2, and the planarizing layer 181 can be formed of an organic material, such as, for example, benzocyclobutene (BCB) or acryl.

After forming the insulating layer 179, via holes 180a and 181a, which couple a subsequently formed first electrode layer 191 and either the source electrode 170a or the drain electrode 170b, may be formed in the insulating layer 179. In FIG. 3A, the insulating layer 179 comprises the passivation layer 180 and the planarizing layer 181, and the via holes 180a and 181a, which expose a portion of the drain electrode 170b, may be formed after forming the passivation layer 180 and the planarizing layer 181, respectively. Specifically, an inorganic material, such as SiNx, may be formed on the source/drain electrodes 170a and 170b and the interlayer 160 using a Plasma Enhanced Chemical Vapor Deposition (PECVD) method to form the passivation layer 180. After forming the passivation layer 180, a first via hole 180a may be formed to expose at least a portion of the drain electrode 170b. The entire surface of the passivation layer 180 including the first via hole 180a may then be coated using a photosensitive material such as acryl, and a second via hole 181a may be formed using photolithography.

Figure 3B:
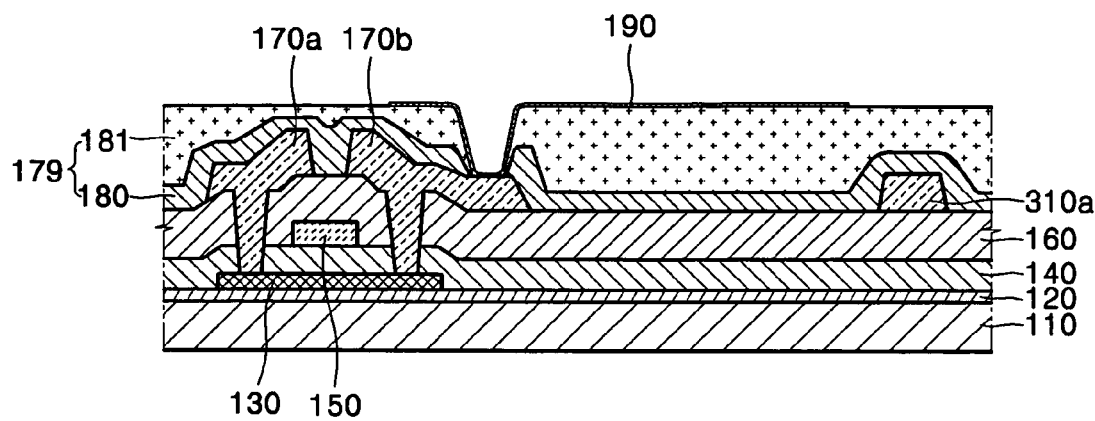

Next, as FIG. 3B shows, an auxiliary conductive layer 190 may be formed on a surface of the planarizing layer 181 including the second via hole 181a. The auxiliary conductive layer 190 can be formed of a variety of materials, such as a metallic layer. The metallic layer may comprise at least one material selected from the group consisting of Mo, W, Ag, Au, Pd, Ni, Cu, Ta, TiN, and MoW. Also, the auxiliary conductive layer 190 can be formed of a transparent conductive oxide such as, for example, ITO, IZO, $SnO_2$, and $In_2O_3$. Hence, the auxiliary conductive layer 190 may be formed of the same material as the first electrode layer 191, which contacts the auxiliary conductive layer 190.

Figure 3C:
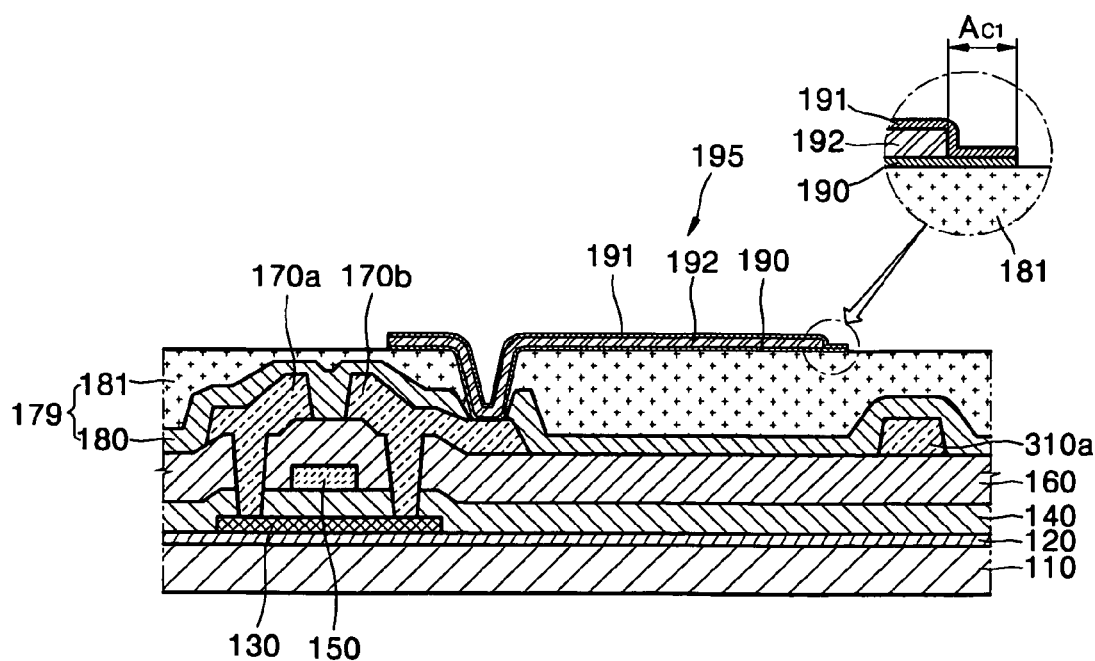

As FIG. 3C shows, a reflection layer 192 and the first electrode layer 191 may then be sequentially formed on the auxiliary conductive layer 190. The reflection layer 192 can be formed of a highly reflective material, such as Al or Al—Nd. Further, the reflection layer 192 can be patterned to a desired structure after depositing a reflective material on the entire surface of the substrate. The reflection layer 192 extends to the via hole 181a (i.e. the reflection layer 192 is formed in the via hole 181a). After forming the reflection layer 192, the first electrode layer 191 may be formed on the reflection layer 192. As noted above, the first electrode layer 191 may be formed of a material having an appropriate work function, such as ITO, IZO, $SnO_2$, $In_2O_3$, if the first electrode layer is used as an anode.

The auxiliary conductive layer 190 may contact at least a portion of the first electrode layer 191. As FIG. 3C shows, the auxiliary conductive layer 190 and the first electrode layer 191 contact each other at a region $A_{C1}$, which is located beyond an end of the reflection layer 192. The contacting region $A_{C1}$ efficiently couples the auxiliary conductive layer 190 and the first electrode layer 191.

Figure 3D:
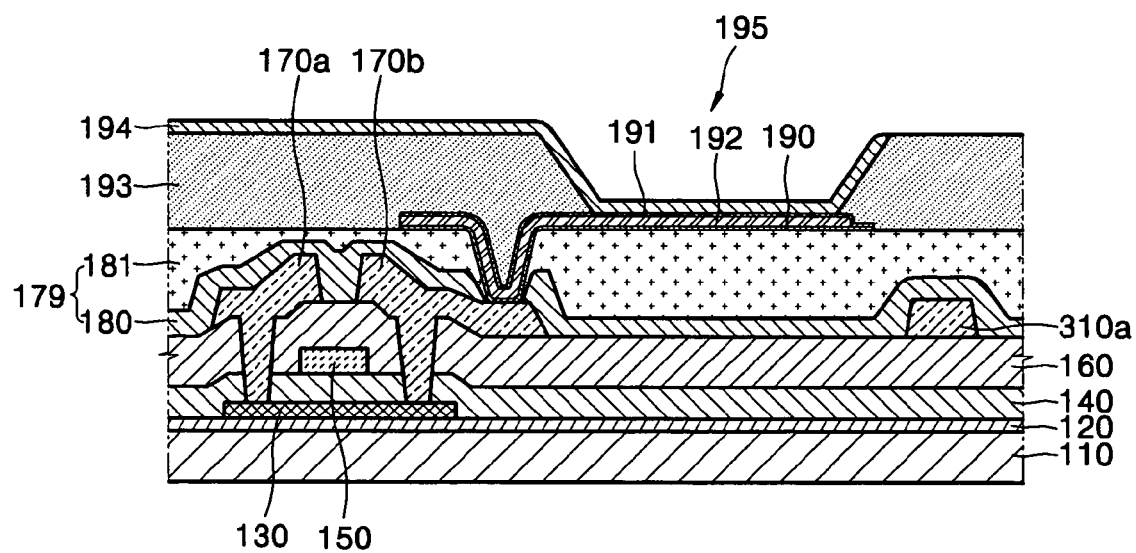

After forming the first electrode layer 191, as FIG. 3D shows, a pixel defining layer 193 may be formed on at least a portion of the first electrode layer 191 so that at least a portion of the first electrode layer 191 corresponds to a pixel opening 195. Next, the intermediate layer 194 including the organic light emitting layer may be formed on a surface of the first electrode layer 191 in the pixel opening 195. An organic electroluminescence display device, as shown in FIG. 2A and FIG. 2C, can be formed by then forming the second electrode layer 400 to cover the display region 200.

The intermediate layer 194 having at least the organic emitting layer can be formed of a low molecular weight or polymer organic film. If formed of a low molecular weight organic film, the intermediate layer 194 can be formed in a single or composite layer structure by stacking a Hole Injection Layer (HIL), a Hole Transport Layer (HTL), the organic emitting layer, an Electron Transport Layer (ETL), and an Electron Injection Layer (EIL). An organic material that can be used for forming the intermediate layer 194 include, for example, copper phthalocyanine (CuPc), N,N'-Di(naphthalene-1-yl)-N,N'-diphenyl-benzidine (NPB), and tris-8-hydroxyquinoline aluminum (Alq3). The low molecular weight organic film can be formed by an evaporation method, for example.

If the intermediate layer 194 is formed of a polymer organic film, it can have a structure including an HTL and the emitting layer. In this case, the HTL can be formed of, for example, PEDOT and the EML can be formed of, for example, Poly-Phenylenevinylene (PPV) and Polyfluorene. The polymer organic film can be formed by various methods including a screen printing method or an ink jet printing method.

The second electrode layer 400 (a cathode) may be deposited on the entire surface of the intermediate layer 194, but the present invention is not limited thereto. The second electrode layer 400 may be formed of a material such as, for example, Al/Ca, ITO, and Mg—Ag according to the type of emission. Further, it may be formed in many different forms, such as a multiple layer, and it can further include an alkali or alkali earth fluoride layer, such as a LiF layer.

Figure 4A:
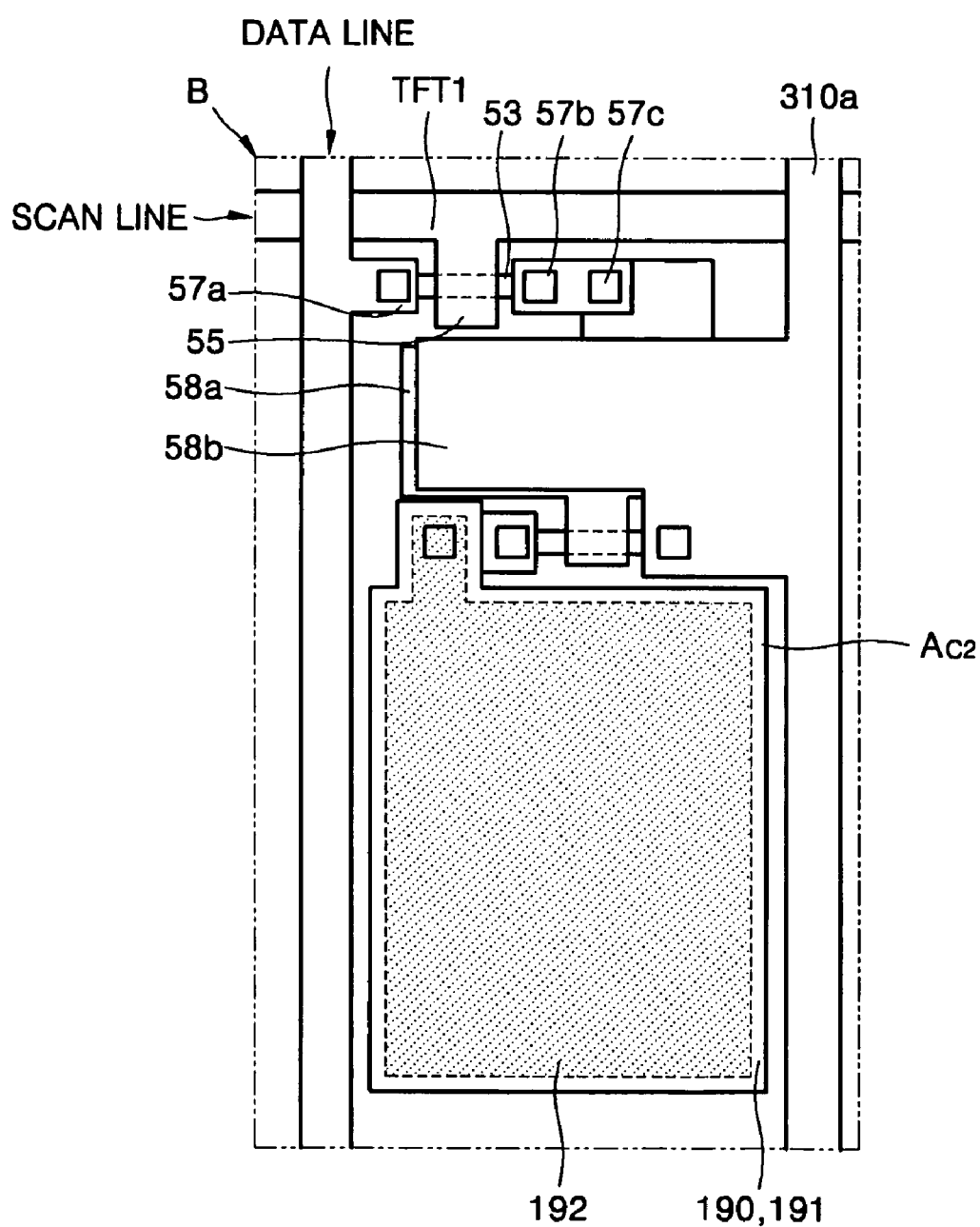
FIG. 4A is a partial cross-sectional view showing an organic electroluminescence display device according to an exemplary embodiment of the present invention.
Figure 4B:
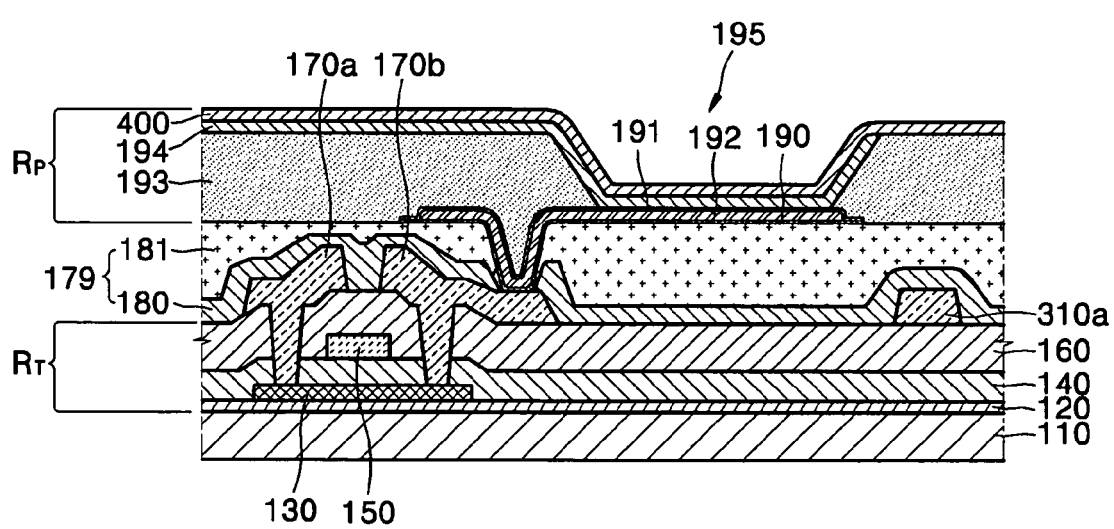
FIG. 4B is a cross-sectional view of a pixel of FIG. 4A.

In an organic electroluminescence display device according to another exemplary embodiment of the present invention, the first electrode layer 191 and the auxiliary conductive layer 190 can surround the interposed reflection layer 192. More specifically, as shown in FIG. 4A and FIG. 4B, which is a partial cross-sectional view of FIG. 4A, the reflection layer 192 is interposed between the first electrode layer 191 and the auxiliary conductive layer 190, and extending the first electrode layer 191 and the auxiliary conductive layer 190 beyond ends of the reflection layer 192 increases an area of the contacting region $A_{C2}$ between the first electrode layer 191 and the auxiliary conductive layer 190. Therefore, the contacting region $A_{C2}$, which is shown by the dotted line of FIG. 4A, may efficiently couple the first electrode layer 191 to the auxiliary conductive layer 190, thereby preventing reduced brightness or brightness non-uniformity in the display region due to a voltage drop.

A variety of configurations may be utilized to couple the first electrode layer 191 and the auxiliary conductive layer 190. For example, the first electrode layer 191 and the auxiliary conductive layer 190 may contact each other through an outside and/or inner side of a via hole (not shown) in the reflection layer 192.

The present invention is not limited to the embodiments described above. For example, although the present invention is described with respect to an organic electroluminescent display device, it may also be applied to other display devices including an inorganic electroluminescent display device.

The present invention may provide the following advantages.

First, in an electroluminescence display device that includes a reflection layer, a voltage drop that can occur when electrically connecting a TFT layer to a pixel layer can be reduced by connecting a first electrode layer to a source or drain electrode through an auxiliary conductive layer, thereby improving brightness in the display region.

Second, an efficient electrical connection can be achieved between a source or drain electrode and a first electrode layer by extending the first electrode layer and an auxiliary conductive layer beyond ends of a reflection layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An electroluminescence display device, comprising:
   a thin film transistor layer on a substrate;
   an insulating layer; and
   a pixel layer that includes a first electrode layer, a second electrode layer, and an intermediate layer interposed between the first electrode layer and the second electrode layer and having at least a light emitting layer,
   wherein the pixel layer further includes a reflection layer that is disposed under the first electrode layer and that extends to a via hole in the insulating layer, and an auxiliary conductive layer disposed under the reflection layer, and
   wherein the auxiliary conductive layer extends to the via hole, and the first electrode layer is substantially transparent and has an extended portion that directly contacts an extended edge portion of the auxiliary conductive layer.

2. The electroluminescence display device of claim 1, wherein the first electrode layer and the auxiliary conductive layer contact each other outside of the via hole.

3. The electroluminescence display device of claim 1, wherein the first electrode layer and the auxiliary conductive layer contact each other beyond an end of the reflection layer.

4. The electroluminescence display device of claim 1, wherein the reflection layer is entirely surrounded by the first electrode layer and the auxiliary conductive layer.

5. The electroluminescence display device of claim 1, wherein the auxiliary conductive layer comprises a transparent conductive oxide.

6. The electroluminescence display device of claim 1, wherein the auxiliary conductive layer and the first electrode layer are formed of a same material.

7. The electroluminescence display device of claim 1, wherein the auxiliary conductive layer is formed of at least one material selected from the group consisting of Mo, W, Ag, Au, Pd, Ni, Cu, Ta, TiN, and MoW.

8. The electroluminescence display device of claim 1, wherein the insulating layer comprises a passivation layer formed on the thin film transistor layer and a planarization layer formed on the passivation layer.

\* \* \* \* \*